United States Patent
Ganley

(10) Patent No.: US 10,673,381 B2
(45) Date of Patent: Jun. 2, 2020

(54) COOLANT LOOP FOR TROUGH REFLECTOR SYSTEMS WITH SOLAR CELLS

(71) Applicant: James T Ganley, St. Paul, MO (US)

(72) Inventor: James T Ganley, St. Paul, MO (US)

(73) Assignee: James T. Ganley, St. Paul, MO (US)

(*) Notice: Subject to any disclaimer, the term of this patent is extended or adjusted under 35 U.S.C. 154(b) by 0 days.

(21) Appl. No.: 15/981,728

(22) Filed: May 16, 2018

(65) Prior Publication Data
US 2019/0356267 A1  Nov. 21, 2019

(51) Int. Cl.
| | |
|---|---|
| H01L 31/042 | (2014.01) |
| H02N 6/00 | (2006.01) |
| H02S 40/42 | (2014.01) |
| H02S 40/22 | (2014.01) |
| F28F 23/02 | (2006.01) |

(52) U.S. Cl.
CPC ............ H02S 40/425 (2014.12); H02S 40/22 (2014.12); *F28F 23/02* (2013.01); *F28F 2250/08* (2013.01)

(58) Field of Classification Search
CPC ..... H02S 40/425; H02S 40/42; F28F 2250/00
USPC .................. 136/246; 126/583, 590, 634, 640
See application file for complete search history.

(56) References Cited

U.S. PATENT DOCUMENTS

| | | | | |
|---|---|---|---|---|
| 4,169,460 A | * | 10/1979 | Popovich | ............... F24S 80/30 126/589 |
| 2019/0056147 A1 | * | 2/2019 | Brisebois | ............... B23P 15/26 |

* cited by examiner

*Primary Examiner* — Angelo Trivisonno

(57) ABSTRACT

A coolant loop for trough-reflector solar energy conversion systems has open coolant supply and discharge reservoirs. Coolant is driven by siphoning pressure through cooling channels which have attached solar cell arrays. The siphoning pressure is produced by maintaining the free surface of coolant in a coolant supply reservoir at a higher elevation than the free surface of coolant in a coolant discharge reservoir. The cooling channels have air evacuation and air inlet ports to facilitate initiation and termination of siphon-pressure-driven coolant flow. The cooling channels also have in-line flow control valves that respond to control signals generated by coolant temperature sensors.

6 Claims, 7 Drawing Sheets

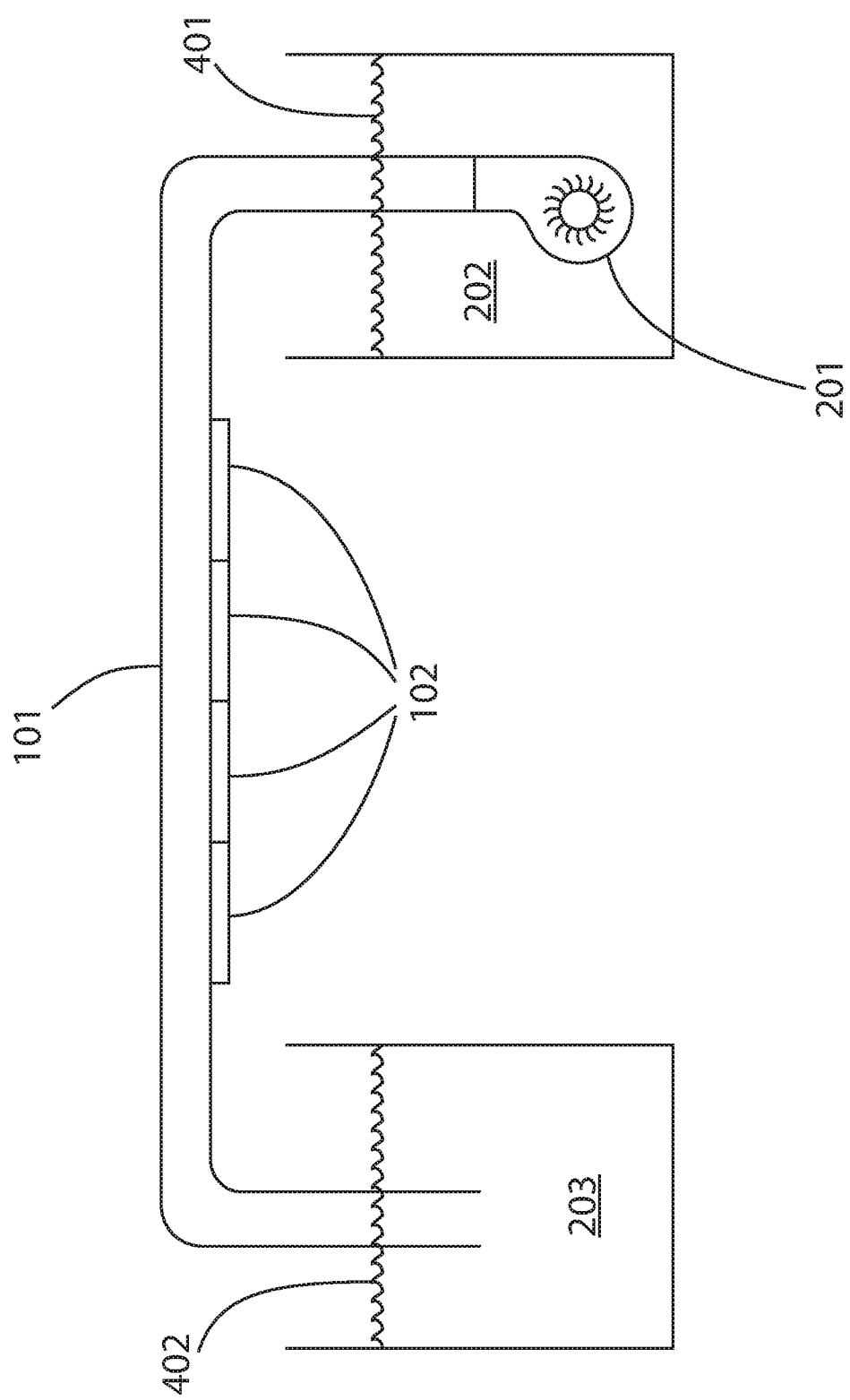

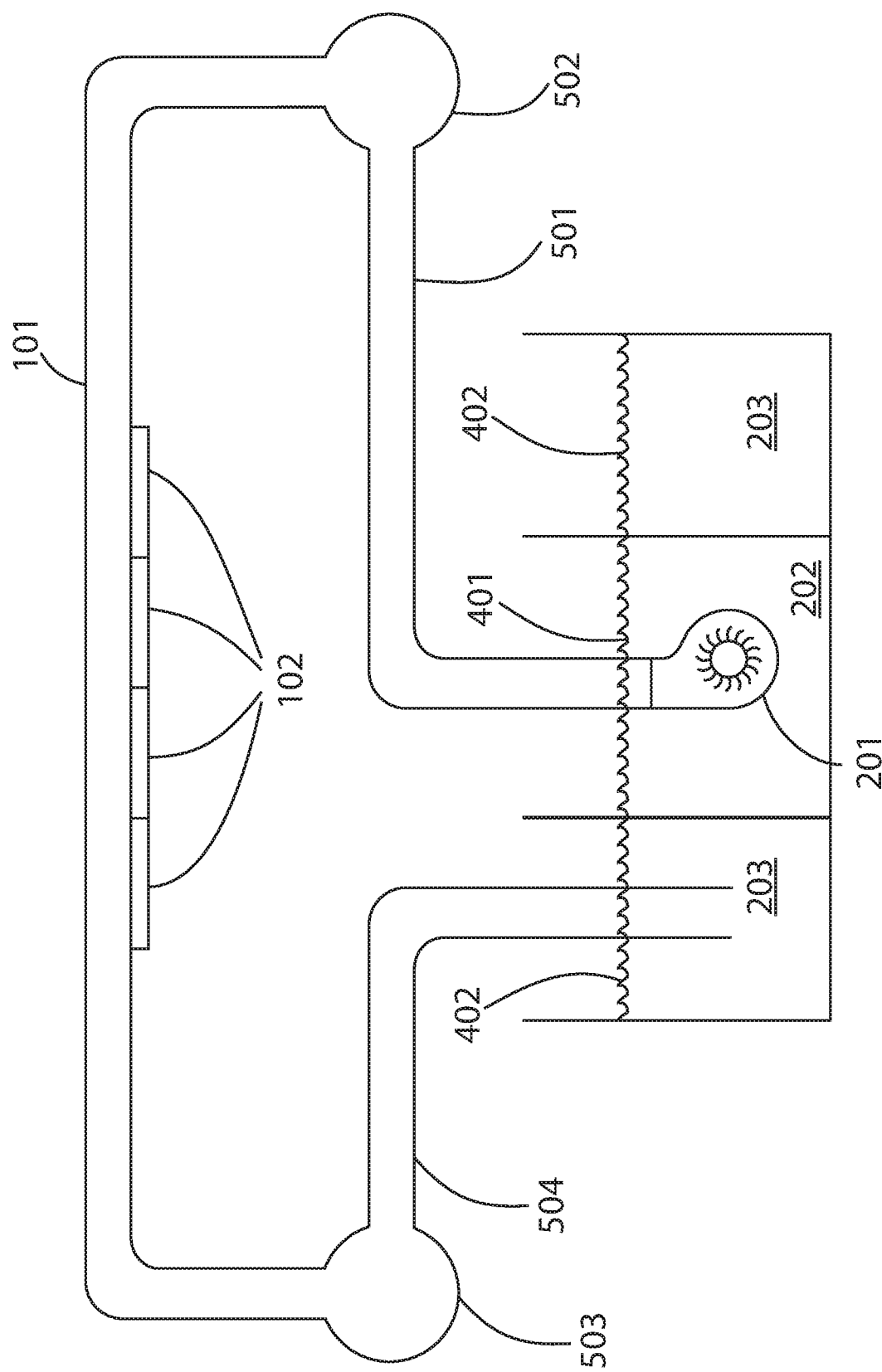

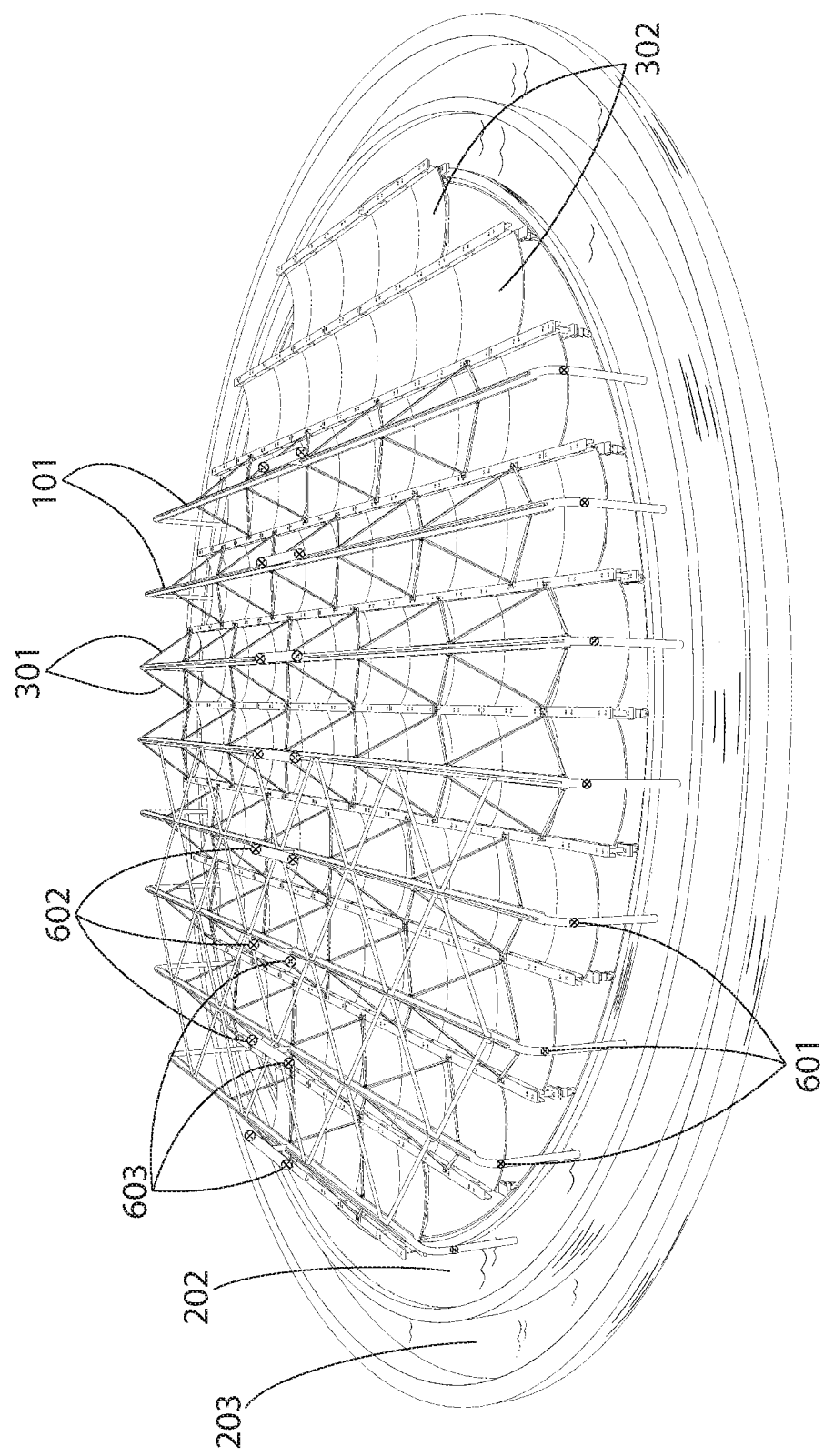

COOLANT LOOP FOR TROUGH REFLECTOR SYSTEMS WITH SOLAR CELLS

BACKGROUND OF THE INVENTION

This invention relates generally to solar energy conversion systems that have trough reflectors and solar cell arrays; more specifically, this invention relates to an improved method of providing coolant for solar cell arrays that are exposed to concentrated sunlight produced by trough reflectors.

Trough reflectors concentrate incident radiation in one spatial dimension. They are frequently used in solar energy conversion systems to collect solar radiation and redirect it towards receiver assemblies.

A trough reflector system can have either of two types of receiver assemblies: thermal receiver assemblies or solar cell receiver assemblies. A thermal receiver assembly usually consists of a vacuum-jacketed cylindrical tube through which flows a fluid capable of withstanding temperatures of several hundred degrees. Concentrated solar radiation incident on the tube heats the fluid which is then passed through a heat exchanger (boiler) to produce steam for driving a heat engine.

A solar cell receiver assembly, on the other hand, cannot operate efficiently at high temperatures because it contains temperature-sensitive solar cells. In a trough reflector system with solar cell receiver assemblies, solar cell arrays are positioned so as to intercept concentrated solar radiation coming from the system's trough reflectors. Solar radiation incident on the solar cells generates electricity directly, without the need for a steam-cycle generator. If the intensity of the concentrated radiation falling on the solar cells is greater than a few suns, the solar cell arrays must be actively cooled in order to achieve best system performance. The present invention reveals an innovative improvement of the technology used for cooling the solar cell arrays. When implemented, this new technology provides important system simplifications, thereby increasing the reliability and reducing the cost of trough reflector systems that have solar cell receiver assemblies.

BRIEF DESCRIPTION OF THE INVENTION

In designing a trough reflector system that has solar cell receiver assemblies, special consideration must be given to the design of the hardware that cools the solar cell arrays. In general, that hardware takes the form of a coolant loop, which is an assembly of interconnected conduits, pumps, heat exchangers, reservoirs, etc. that drives and guides coolant around a hydraulic circuit. As the coolant circulates around the coolant loop, it accepts thermal energy from solar cells and then transfers that energy through a heat exchanger into an external thermal reservoir.

A key element of the coolant loop in this type of trough reflector system is a set of solar cell receiver assemblies aligned in one-to-one correspondence with the system's trough reflectors. Each solar cell receiver assembly includes a cooling channel with attached solar cell arrays. When the trough reflector system is operating, each cooling channel continuously receives relatively low temperature coolant from a coolant supply reservoir. As the coolant passes through the cooling channels, it absorbs thermal energy from the solar cell arrays. Then the heated coolant is discharged into a coolant discharge reservoir.

The present invention reveals an arrangement of coolant loop components that enables the utilization of siphon pressure to drive coolant through cooling channels. Generally, this cooling technique involves keeping the same pressure—usually atmospheric pressure—on the upper surfaces of the coolant supply and discharge reservoirs. (If the upper surface of a liquid is exposed to the atmosphere, that surface is said to be a free surface. An open reservoir or conduit contains liquid with a free surface. Similarly, a closed conduit or reservoir contains a liquid that is not exposed to the atmosphere; and therefore the liquid within it does not have a free surface.)

In systems having open coolant supply and discharge reservoirs, siphon pressure can be developed if the free surface of coolant in the coolant supply reservoir is higher (greater gravitational potential energy) than the free surface of the coolant in the coolant discharge reservoir (lower gravitational potential energy). If a set of cooling channels is placed so as to provide coolant flow passages between the two reservoirs, the gravitational potential energy of the coolant in the supply reservoir can force coolant to move through the cooling channels and into the coolant discharge reservoir. This gravity-driven flow can occur even if portions of the cooling channels are at a higher elevation than the level of the free surface of the coolant in the coolant supply reservoir—in which case the gravitational force driving the flow is said to produce siphon pressure. Certain conditions must be met to enable siphon pressure to drive coolant flow though the cooling channels, namely that (1) the intake ports of the cooling channels are submerged below the free surface of the coolant in the coolant supply reservoir, (2) the discharge ports of the cooling channels are submerged below the free surface of the coolant in the coolant discharge reservoir, and (3) the cooling channels are closed conduits with all gaseous species evacuated from their interior.

Without special preparation of the coolant, cavitation will prevent siphon-pressure driven flow if the highest point in a cooling channel is more than 10 meters above the free surface of the coolant in the coolant supply reservoir. This 10-meter limit is not encountered in practical trough reflector systems. (The 10-meter limit exists when the density of the coolant is approximately equal to the density of water, which is normally the case in trough reflector systems with solar cell arrays. Coolant with a different value of density will have a different height differential limit.)

In considering the practical applicability of the cooling technology discussed above, it is important to note that there are two distinct types of trough reflector systems. One type has trough reflectors that are permanently oriented in a specific direction, usually in either a North/South direction or an East/West direction. Because of the fixed orientation, each reflector must tilt (roll, pivot, rotate) about an axis parallel to its focal line in order to accomplish sun tracking. Systems of this type are referred to herein as Tilting Trough Reflector (TTR) systems. In TTR systems, the position and orientation of the receiver assemblies remain fixed, or nearly fixed, as the reflectors tilt to track the sun. This means that the inlet and discharge ports of the cooling channels stay in a fixed location while the system is operating.

In a second type of trough reflector system, a type originally revealed in U.S. Pat. No. 4,159,629, the trough reflectors do not have a fixed orientation. Instead, the trough reflectors rotate in a horizontal plane about a central vertical axis to accomplish sun tracking. Systems of this type are referred to herein as Vertical Axis Trough Reflector (VATR) systems. During operation of a VATR system, the receiver assemblies must rotate through large angles because the entire system rotates as an integrated unit in order to track the sun. This means that the cooling channel inlet and discharge ports move over considerable distances while the system is operating.

The proposed use of siphoning technology is applicable to both TTR and VATR systems. However, greater benefits are achieved in VATR systems. This is because cooling apparatus for the essentially stationary receiver assemblies in a TTR system can be relatively simple and the task of providing coolant to solar cell arrays is adequately addressed with existing technology. The coolant loop hardware in a TTR system usually takes the form of a closed assembly, that is, the circulating coolant is never exposed to the atmosphere. One pump, or a set of pumps operating in parallel, can provide the pressure difference required to drive the coolant completely around the closed coolant loop. A pump used in this way is referred to as a recirculating pump. (Recirculating pumps are to be distinguished from the cooling channel pumps that are used in some systems to drive coolant through individual cooling channels.)

The cooling apparatus for a VATR system is more complex than for a TTR system, owing to the fact that, in a VATR system, the intake and discharge ports for the cooling channels move over large distances while sun tracking occurs. This problem is addressed in some VATR systems (U.S. Pat. No. 7,891,351) by means of a closed coolant loop having centrally-located coolant supply and discharge reservoirs. This approach creates problems related to (1) the reliability of the centrally-located rotating seals, (2) the amount of energy consumed by the recirculating pump(s), and (3) localized blockage of incoming sunlight. A VATR system revealed in U.S. Pat. No. 9,705,448 solves these three problems by introducing a coolant loop having open supply and discharge reservoirs, with the reservoirs located at the periphery of the rotating portion of the system. The open supply and discharge reservoirs eliminate the need for rotating seals, minimize the energy consumed by the recirculating pump(s), and avoid localized sun blocking. However, the system revealed U.S. Pat. No. 9,705,448 requires a cooling channel pump for each cooling channel and those cooling channel pumps must rotate with the rest of the system. The present invention is an improvement of the systems revealed in the aforementioned patents. This invention uses the open supply and discharge reservoirs in such a way that, in addition to eliminating the three problems mentioned above, the need for cooling channel pumps is eliminated by utilizing siphon pressure to drive coolant through the cooling channels.

The net result of the improvements offered by the present invention is that TTR and VATR systems with solar cell receiver assemblies will have reduced fabrication and installation costs, lower maintenance costs, and improved reliability.

BRIEF DESCRIPTION OF THE DRAWINGS

FIG. 4 shows an elevation view of a cooling channel in a VATR system with open coolant supply and discharge reservoirs located at the periphery of the system.

FIG. 5 shows an elevation view of a cooling channel in a VATR system with open coolant supply and discharge reservoirs located at the center the system.

FIG. 6B shows a perspective view of a VATR system with a multiplicity of cooling channels of the type shown in FIG. 6A, with liquid flow in the cooling channels maintained by siphoning pressure produced by an elevation difference between the free surfaces of the open coolant supply and discharge reservoirs.

DETAILED DESCRIPTION OF THE INVENTION

This specification uses terms which may have a technical meaning that differs from the meaning assumed in everyday usage. The following paragraphs contain definitions and explanations of various terms and concepts with regard to the meaning intended herein.

The term "trough reflector" is used herein to designate an elongated reflector that concentrates incident solar radiation in one spatial dimension, thereby producing solar radiation with intensity greater than—usually several times greater than—the intensity of unconcentrated sunlight. The term "trough reflector system" is used herein to designate a solar energy conversion system which has a set of trough reflectors that collect and concentrate solar radiation, and direct that concentrated radiation towards solar cell arrays. In a trough reflector system, the longitudinal axes of the individual trough reflectors are parallel and all of the trough reflectors execute identical movement in order to track the sun.

Figure 1:
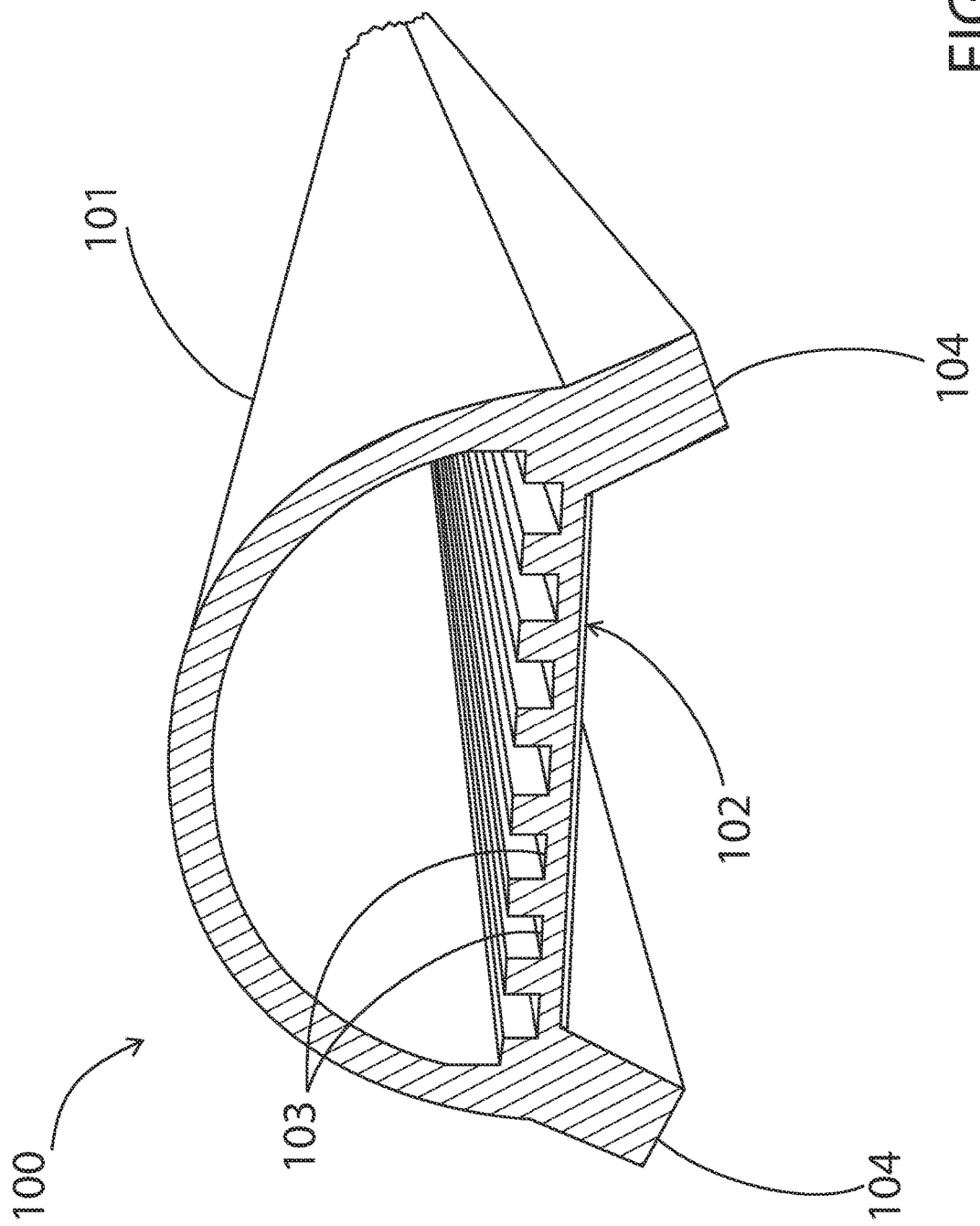
FIG. 1 shows a cooling channel with attached solar cell arrays.

The terms "receiver," "receiver assembly," and "solar cell receiver assembly" are used herein to designate a mechanical assembly which includes a cooling channel and a set of solar cell arrays that are attached to a wall of that cooling channel. When a trough reflector system is operating, each of its cooling channels is positioned and aligned so that the attached solar cell arrays can intercept and absorb concentrated solar radiation produced by a trough reflector. FIG. 1 shows specific prior art (revealed in U.S. Pat. No. 9,705,448) that relates to a trough reflector system's receiver assemblies. Receiver assembly 100 is comprised of cooling channel 101 and planar solar cell arrays 102 which are attached to the exterior of a flat wall of cooling channel 101. Longitudinal grooves 103 on the interior of the flat wall improve heat transfer from solar cell arrays 102 to the coolant flowing through the interior of cooling channel 101. Exterior fins 104 are intended to enhance light collection and to protect attached solar cell arrays 102 from wind-blown debris.

A trough reflector system generally has several trough reflectors and it has one receiver assembly for each trough reflector. Each trough reflector directs concentrated solar radiation towards one and only one receiver assembly and each receiver assembly intercepts concentrated solar radiation coming from one and only one trough reflector. The term "optically associated" is used herein to refer to the one-to-one relationship between a trough reflector and its targeted receiver assembly, or equivalently, the term is used to refer to the one-to-one relationship between a trough reflector and the set of solar cell arrays that are part of the targeted receiver assembly. A receiver assembly's solar cell arrays absorb concentrated solar radiation provided by the optically associated trough reflector and they convert a portion of that absorbed solar radiation into electricity. The invention revealed herein relates solely to trough reflector systems with solar cell receiver assemblies.

If the intensity of the solar radiation falling on a receiver assembly's solar cell arrays is greater than a few suns—which is normally the case during operation of a trough reflector system—active cooling of the solar cell arrays is necessary in order to achieve best system performance. Active cooling is usually accomplished by circulating liquid coolant through a coolant loop, which is an assembly of interconnected conduits, pumps, valves, heat exchangers, reservoirs, etc. that drives and guides coolant around a hydraulic circuit. It is to be understood that, for the purposes of this specification, a coolant loop is considered to be a component of a trough reflector system. Also, it is to be understood that the coolant circulating through a trough reflector system's coolant loop is a liquid.

The terms "surface" and "liquid surface" are used herein to designate the interface between a liquid and a gas. The term "free surface" is used herein to designate a liquid surface that is exposed to the atmosphere and thereby subjected to atmospheric pressure. The terms "open conduit" and "open reservoir" are used herein to designate conduits or reservoirs, respectively, which contain a volume of liquid having a free surface. The terms "closed conduit" and "closed reservoir" are used herein to designate conduits or reservoirs, respectively, which contain a volume of liquid that is not exposed to the atmosphere; therefore, a liquid within a closed conduit or reservoir does not have a free surface.

The term "cooling channel" is used herein to designate a conduit to which solar cell arrays are attached. A cooling channel is a component of a trough reflector system's coolant loop. For the purposes of this specification, a cooling channel is said to have a coolant inlet port at one of its ends, a coolant discharge port at its other end, and an in-line flow control valve between the coolant inlet port and the attached solar cell arrays. The flow of coolant is said to occur from a cooling channel's inlet port to its discharge port, with thermal energy from solar cell arrays being absorbed by the coolant as it makes the end-to-end transit. The coolant flow rate through a cooling channel is regulated, in part, by its in-line flow control valve. The terms "adequate cooling" and "adequate coolant flow" are used herein to refer to coolant flow rates—within a cooling channel—that are sufficient to keep the temperature of the attached solar cells below a previously specified maximum allowable temperature, thus ensuring long operating life and high efficiency for the solar cells. The term "coolant supply reservoir" is used herein to designate an enclosure containing coolant that is continuously available for intake at the inlet port of a cooling channel. Similarly, the term "coolant discharge reservoir" is used herein to designate an enclosure that can continuously accept coolant flowing from the discharge port of a cooling channel. A cooling channel is generally maintained as a closed conduit during operation of its parent trough reflector system. Since a cooling channel is generally a closed conduit, it is possible to use a vacuum pump to withdraw air and/or other gases from its interior, leaving only liquid coolant within. For the purposes of this specification, it is understood that the portion of a cooling channel to which solar cell arrays are attached is at a higher elevation than the coolant surface in either the supply or discharge reservoirs.

The terms "siphon pressure" and "siphoning pressure" are used herein to designate a pressure difference generated by an unbalanced gravitational force that is transmitted through a liquid by the continuous chain of cohesive bonds that holds elemental volumes of the liquid together. If two separated liquid surfaces are exposed to the same pressure—whether atmospheric or some other pressure or even a near vacuum—and if the elevation of one of the liquid surfaces is higher than the elevation of the other, an unbalanced gravitational force acting on the volume of liquid between the two surfaces (which could be a volume of liquid contained within a closed conduit) will cause liquid to flow away from the higher surface and towards the lower surface. This gravity-driven flow can occur even if some portion of the liquid volume connecting the two surfaces is at a higher elevation than either of the liquid surfaces—in which case the flow produced by the unbalanced gravitational force is said to be driven by siphoning pressure.

The term "flow passage" is used herein to designate an elongated mechanical construct such as a tube, pipe, conduit, channel, etc. which permits the flow of a liquid from one of its ends to the other when the liquid is subjected to some particular set of forces. For example, a cooling channel is said to be disposed as a flow passage with respect to siphoning pressure if the siphoning pressure can drive liquid through the interior of the cooling channel from one end to the other. However, if a volume of air is introduced into the cooling channel, thereby separating the interior coolant into two separated volumes of liquid, the siphoning pressure is negated and the coolant flow is disrupted. Then the cooling channel is no longer a flow passage with respect to siphoning pressure because the internal volume of air acts as an impediment to coolant flow. This same cooling channel, with an air volume blocking coolant flow driven by siphoning pressure, could still be a flow passage with respect to mechanical forces exerted by a pump—if the pump could provide sufficient pressure to force coolant through the cooling channel in spite of the internal volume of air.

Figure 2:
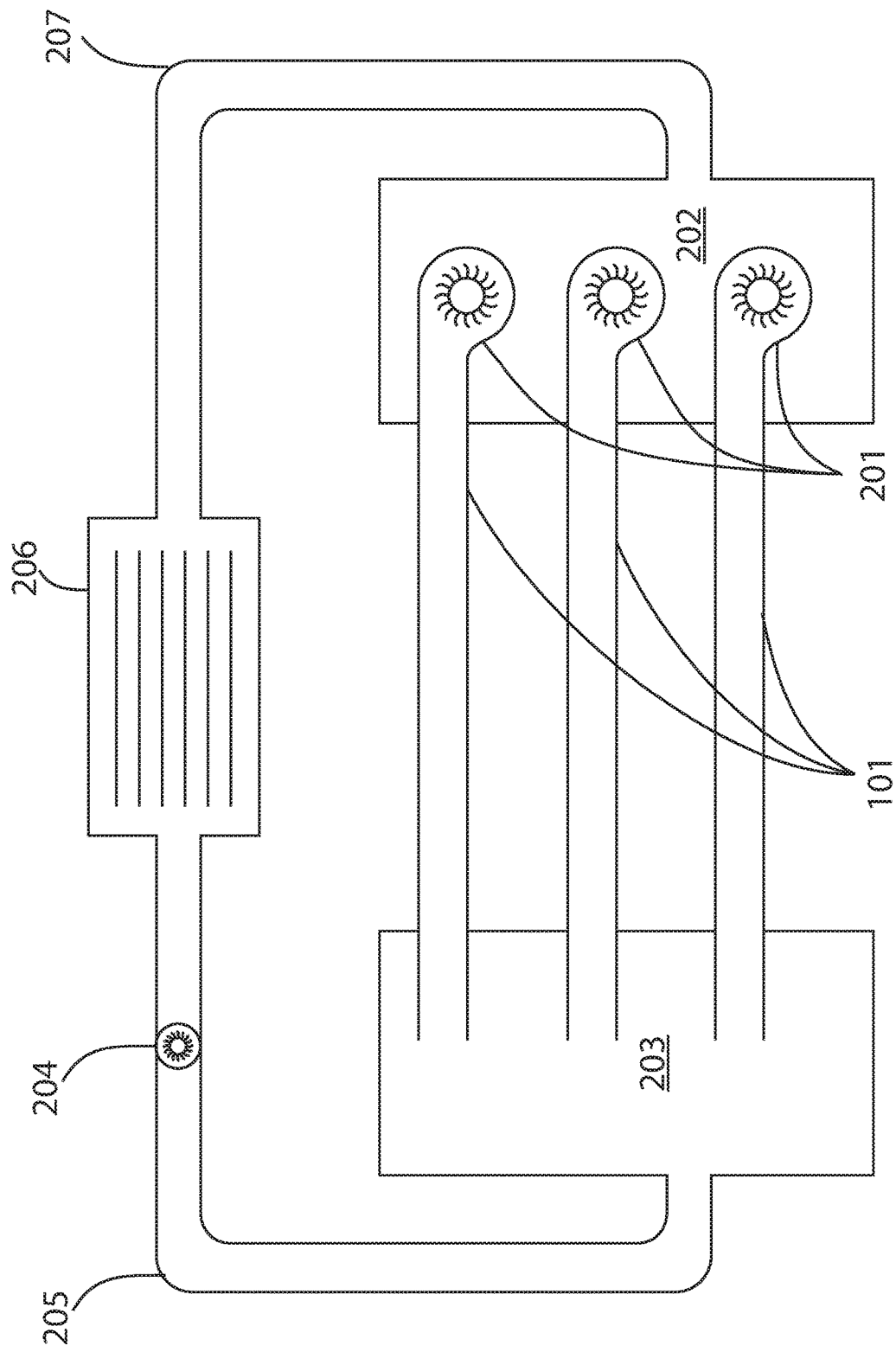
FIG. 2 shows a simple coolant loop for trough reflector systems.

FIG. 2 is a schematic of general prior art as it relates to a simple coolant loop for trough reflector systems. The figure shows cooling channel pumps 201 forcing the flow of coolant from coolant supply reservoir 202, through cooling channels 101, and into coolant discharge reservoir 203. Coolant is withdrawn from coolant discharge reservoir 203 by the action of recirculating pump 204, which provides sufficient pressure to move coolant through coolant transfer line 205, through heat exchanger 206, through coolant transfer line 207, and back into coolant supply reservoir 202.

The present invention reveals a coolant loop that provides improvements to the prior art revealed in FIG. 2 by utilizing siphoning pressure to drive coolant through the cooling channels. There are total of six conditions which, when taken together, are sufficient to enable cooling channels to function as a coolant flow passages with respect to siphoning pressure. Expressed in terms of the definitions given above, the six conditions are (1) that the coolant supply reservoir is an open reservoir, (2) that the coolant discharge reservoir is an open reservoir, (3) that the free surface of the coolant in the coolant supply reservoir is at a higher elevation than the free surface of the coolant in the coolant discharge reservoir, (4) that the inlet port of each cooling channel is submerged beneath the free surface of the coolant in the coolant supply reservoir, (5) that the discharge port of each cooling channel is submerged beneath the free surface of the coolant in the coolant discharge reservoir, and (6) that the internal volume of each cooling channel is completely devoid of air and other gaseous species.

When the components of a trough reflector system's coolant loop are arranged and interconnected as described above—thus enabling the cooling channels to function as flow passages with respect to siphoning pressure—the siphoning pressure, $P_s$, exists as an end-to-end pressure drop across each of the system's cooling channels. The pressure $P_s$ drives coolant through the cooling channels as long as they are disposed as flow passages with respect to siphoning pressure. The relationship between $P_s$ and the elevation difference, H, between the free surface of the coolant in the coolant supply reservoir and the free surface of the coolant in the coolant discharge reservoir is given by:

$$P_s = \rho g H,$$

where $\rho$ is the density of the coolant and g is the acceleration of gravity. $P_s$ must be large enough that the coolant flow rate, $F_n$, through the $n^{th}$ cooling channel provides adequate cooling for the solar cell arrays attached to that particular cooling channel. (It is understood that the integer "n" is a cooling channel identifier in the range (1, N) where "N" is equal to the total number of cooling channels in the system.) The coolant flow rate, $F_n$, through the $n^{th}$ cooling channel is related to the siphoning pressure $P_s$ and the elevation difference H by the following equations:

$$F_n = K_n (P_s)^{0.5} = K_n (\rho g H)^{0.5},$$

where $K_n$ is the end-to-end flow coefficient of the $n^{th}$ cooling channel. The other terms in the equations are as defined above. The term "flow coefficient" is used herein to designate the ratio of the flow rate through a specific cooling channel to the square root of the end-to end pressure drop across that channel. (It should be noted that, in this specification, the term "flow coefficient" has a slightly different meaning than it has in normal usage, where the term is usually applied to a valve, rather than an extended conduit. In either case, however, the term "flow coefficient" represents a combination of physical dimensions and material properties that affect flow rate from the inlet port to the discharge port of a mechanical device.)

In a TTR system, the cooling channels all have the same length and the same diameter and they are manufactured from identical materials by using the same processes. Therefore the cooling channels in TTR systems all have nearly identical flow coefficients. In VATR systems, the flow channels can have different lengths and possibly even different diameters. Therefore the cooling channels in VATR systems can have—and usually do have—different flow coefficients. For the purposes of this specification, it is to be understood that each cooling channel has an in-line flow control valve and the flow coefficient of any particular cooling channel may be adjusted downward from some maximum value, $K_{mn}$, by partially closing the channel's flow control valve. $K_{mn}$ is the flow coefficient for the $n^{th}$ cooling channel when the flow control valve is completely open. The value of $K_{mn}$ is a constant for the $n^{th}$ channel and it may be calculated from the physical dimensions and internal surface characteristics of the cooling channel or it may be determined experimentally. The value of $K_n$ is variable and can be controlled by opening or closing the in-line flow control valve.

If the latitude and altitude of the deployment location of a trough reflector system are known, it is possible to calculate the maximum possible value of direct solar irradiance, $I_{YM}$, which can occur at the deployment site during the year. $I_{YM}$ would occur at solar noon of a very clear day, on the day of the year when the sun is most nearly directly overhead at the deployment location. This maximum possible value of solar irradiance produces the maximum possible thermal load that can be imposed on a trough reflector system located at the site. $I_{YM}$ may be used in conjunction with trough reflector system design parameters (maximum allowed temperature of the system's solar cells, dimensions of the solar cell arrays, dimensions of the cooling channels, etc.) to calculate the maximum coolant flow rate, $F_{ymn}$, which would ever be required during the year to provide adequate cooling of the solar cells attached to the $n^{th}$ cooling channel. From the definitions of $K_{mn}$ and $F_{ymn}$, it is seen that, when $I_{YM}$ is the direct solar irradiance, the siphoning pressure, $P_{smn}$, required to provide adequate coolant flow through the $n^{th}$ cooling channel—when its in-line flow control valve is completely open—is given by the square of the ratio of $F_{ymn}$ to $K_{mn}$:

$$P_{smn} = (F_{ymn})^2 (K_{mn})^{-2}$$

For one of the cooling channels in the system, the value of $P_{smn}$ will be as larger as, or larger than the value for any other cooling channel. The largest value of $P_{smn}$—for any of the cooling channels—is referenced herein by the symbol "$P_{smax}$." If the elevation difference, H, between the free surfaces in the coolant supply and discharge reservoirs is set so as to provide a siphoning pressure $P_{smax}$, then the all of the solar cells in the system will have adequate cooling at any time during the year, even when the direct solar irradiance is equal to $I_{YM}$. The term "yearly-critical elevation difference," referenced by the symbol "$N_{yc}$," is used herein to designate the value of the elevation difference, H, between the free surface of the coolant in the coolant supply reservoir and the free surface of the coolant in the coolant discharge reservoir which produces a siphoning pressure $P_{smax}$. $H_{yc}$ is therefore given by:

$$H_{yc} = (F_{ymn})^2 (K_{mn})^{-2} (\rho g)^{-1}$$

where it is understood that "n" in the above equation references the cooling channel with the highest value of the ratio $(F_{ymn})(K_{mn})^{-1}$. When $H_{yc}$ is set at this value, adequate cooling is assured for all of the cooling channels, even when the thermal loading is at its maximum possible value, $I_{YM}$. However, that level of cooling is only needed at solar noon on one particular day of the year. At all other times during the year, direct solar irradiance is reduced to values less than $I_{YM}$ because of changing sun angles and because of atmospheric conditions that block or scatter incoming solar radiation. At those times—when the solar irradiance is less than $I_{YM}$—the cooling channel flow rates should be adjusted downward (because less cooling is required) in order to decrease the power consumed by the system's recirculating pump(s). The coolant flow rates in the individual channels can be adjusted downward by partially closing the in-line flow control valves, one of which is associated with each cooling channel. It is to be understood that $H_{yc}$ is a constant for a given system located at a specific geographic location. $H_{yc}$ always enables a cooling capability that is equal to or greater than what is required for the system. When desired, a lower cooling capability of the cooling channels can be achieved by adjusting the flow coefficients of the individual cooling channels to values lower than $K_{mn}$, that is, by partially closing the channel's in-line flow control valves.

In-line flow control valves can respond quickly to accommodate changes in thermal loading that are caused by differing atmospheric conditions or by the changes in sun angles resulting from either the earth's daily rotation or its orbital movement about the sun. Reducing coolant flow rates in response to varying thermal loads increases overall system efficiency by decreasing the energy consumed by the system's recirculating pump(s).

It is apparent that further system efficiencies can be realized by periodically adjusting the elevation difference H, on a daily, weekly, or monthly basis, instead of leaving it constant for the entire year, year after year. Maximum system efficiency is achieved when the adjustment of H is done on a daily basis, so as to provide adequate cooling when the direct solar irradiance is at its maximum daily value, $I_{DM}$, on each specific day of the year. (It is understood that, unlike $I_{YM}$, $I_{DM}$ is not a site-specific constant, but instead changes each day. $I_{DM}$ is the calculated direct solar irradiance at solar noon on the date in question, with the assumption of a very clear day on that date.) The term "date-critical elevation difference," represented herein by the symbol $H_{dc}$, is used herein to designate the elevation difference between the free surfaces of the coolant supply and discharge reservoirs which produces adequate cooling of all of the system's solar cell arrays at solar noon on a clear day for the date in question. Daily adjustments of H—to provide succeeding date-specific values of $H_{dc}$,—is accomplished by controlling the relative amount of coolant in the coolant supply and discharge reservoirs. This decreases the required operating pressure of the recirculating pump(s), thereby decreasing system energy consumption and increasing overall system efficiency.

The pressure required to maintain adequate coolant flow in the individual cooling channels of a trough reflector systems is relatively small, owing to (1) the large cross sectional area of the cooling channels, and (2) the parallel flow configuration of the multiplicity of cooling channels. As an example, consider a trough reflector system subjected to $I_{YM}$ equal to one kilowatt per square meter, with trough reflector concentration ratio of 30, trough reflector width of 10 meters, trough reflector length of 200 meters, 0.33 meter diameter of the semi-circular cooling channels as shown in FIG. 1, 15% efficiency solar cells, and 15 Kelvins temperature rise of the coolant as it passes through the cooling channels. For this relatively large system and for the conservative estimates given for other system properties, the value of $H_{yc}$ is less than one meter.

Coolant loops in TTR systems are usually closed and they usually have only a recirculating pump—or possibly multiple recirculating pumps operating in parallel—which provides sufficient pressure to drive coolant completely around a coolant loop without the need for individual cooling channel pumps 201 shown in FIG. 2. That implementation of the coolant loop hardware—an implementation which does not have cooling channel pumps—is practical in TTR systems because TTR systems have cooling channels with fixed-position inlet and discharge ports and that makes it relatively easy to implement closed coolant loop hardware. The invention revealed herein provides a method of using siphoning pressure to eliminate the need for cooling channel pumps. The invention can be applied to TTR systems, but the practical advantages of doing so are reduced because a single recirculating pump with sufficient pressure capabilities can also be used to accomplish the same end. However there are some important advantages which can be derived from applying the presently revealed invention to TTR systems. These advantages include simplification of conduit interconnections and decreased pressures at various locations around the coolant loop, especially in the cooling channels themselves.

Figure 3:
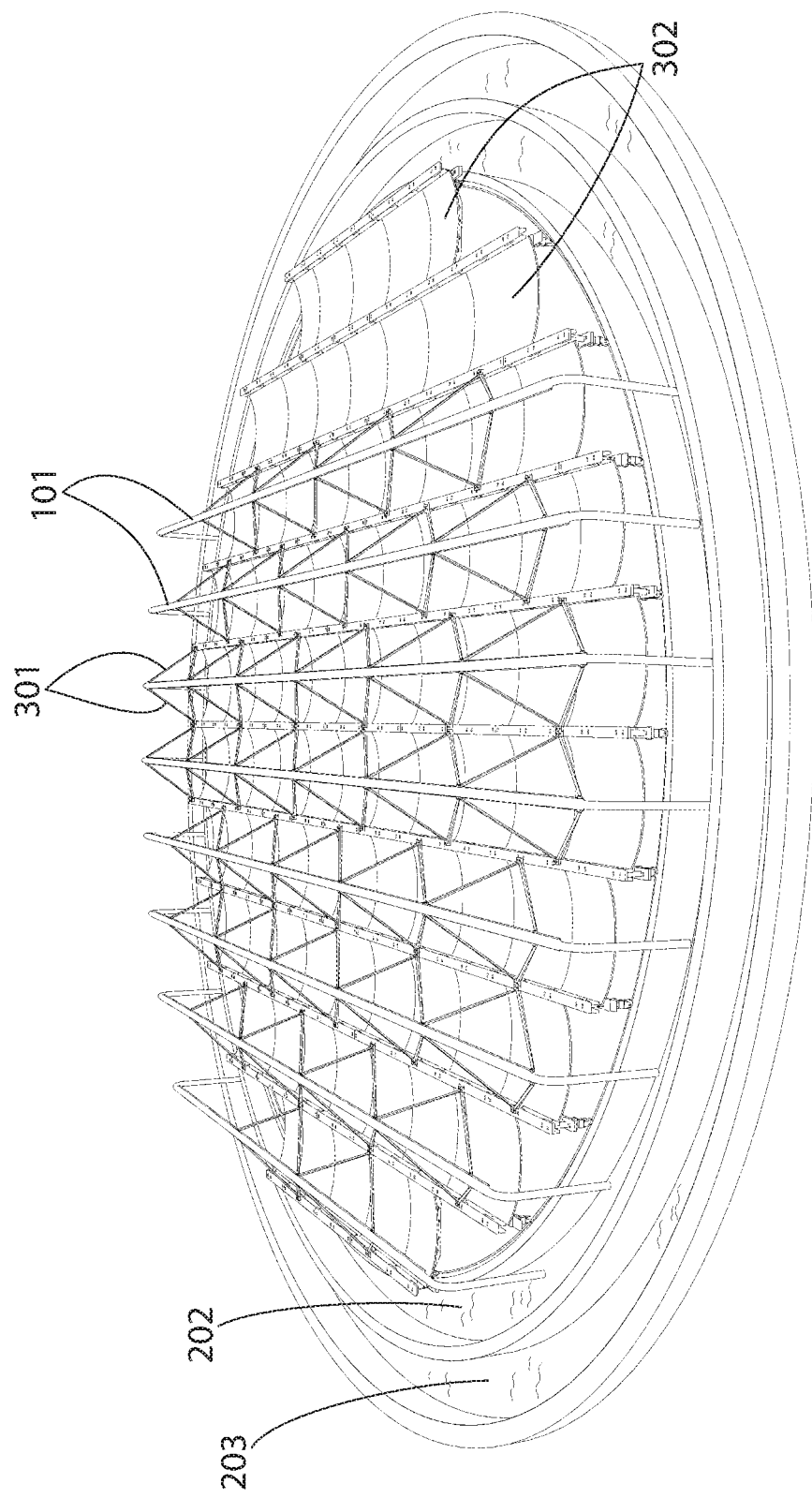
FIG. 3 shows a perspective view of a VATR system with open coolant supply and discharge reservoirs located at the periphery of the system.

When compared to the coolant loops for TTR systems, the coolant loops for VATR systems are more complicated because, in VATR systems, the inlet and discharge ports of the cooling channels move horizontally over large distances as the systems track the sun. If a closed coolant loop is used in a VATR system, as is revealed in U.S. Pat. No. 7,891,351, several design complexities can arise, such as longer conduits for coolant transfer lines, centrally located rotating seals that are difficult to service, increased energy usage by recirculating pumps, and sun blockage by vertical sections of coolant conduits. A VATR system revealed in U.S. Pat. No. 9,705,448 solves these problems by introducing a coolant loop with open supply and discharge reservoirs. An isometric view of the system revealed in that patent is shown in FIG. 3, wherein circular coolant supply reservoir 202 and circular coolant discharge reservoir 203 are positioned at the periphery of the system, thereby enabling continuous coolant flow to and from cooling channels 101 as the system rotates to track the sun. The system's open supply and discharge reservoirs ensure that cooling channels 101 can move over large distances within reservoirs 202 and 203 without encountering an impediment and without the need for sliding or rotating seals. For perspective regarding the position of system components, FIG. 3 also shows receiver assembly support members 301 and trough reflectors 302. A problem with the system revealed in U.S. Pat. No. 9,705,448 is that the system design requires one cooling channel pump for each cooling channel. The present invention is an improvement of the system of U.S. Pat. No. 9,705,448 (which is an improvement of the system revealed in U.S. Pat. No. 7,891,351) in that it uses the open coolant supply and discharge reservoirs in such a way that coolant can be driven through the cooling channels by siphoning pressure. This completely eliminates the need for cooling channel pumps.

FIG. 4 shows an elevation view of individual cooling channel 101 wherein coolant is withdrawn from coolant supply reservoir 202 by cooling channel pump 201. The coolant is then driven though cooling channel 101 and into coolant discharge reservoir 203, thereby providing cooling for solar cell arrays 102. Cooling channel pump 201 provides the pressure required to overcome frictional losses retarding coolant flow through cooling channel 101 and also it provides a means (with 201 being a variable speed pump) of regulating the coolant flow rate in response to varying thermal loads. In FIG. 4, the free surfaces 401 and 402 in coolant supply and discharge reservoirs 202 and 203 are shown to be at the same elevation, but the cooling channel pump 201 can control coolant flow regardless of the relative elevation of the free surfaces.

FIG. 5 shows an elevation view of a cooling channel of the type shown in FIG. 4, with the difference between the figures being that FIG. 5 shows the coolant supply and discharge reservoirs 202 and 203 are centrally located relative to the rotating portion of the parent VATR system. In FIG. 5, circular coolant discharge reservoir 203 is contiguous with circular coolant supply reservoir 202. FIG. 5 shows cooling channel pump 201 drawing coolant from coolant supply reservoir 202, driving it through coolant transfer line 501, and into coolant supply manifold 502. Coolant supply manifold 502 connects the input ports of all the system's cooling channels 101, only one of which is shown in FIG. 5. After flowing through cooling channel 101, coolant enters coolant discharge manifold 503 and then returns to coolant discharge reservoir 203 through coolant transfer line 504. It should be noted that centrally located supply and discharge reservoirs place additional demands on cooling channel pumps 201 due to the length of coolant transfer lines 501 and 504.

There are no cooling channel pumps in the coolant loop revealed by the present invention. Coolant is moved through cooling channels by siphoning pressure generated by maintaining the free surface of the coolant in the coolant supply reservoir at a higher elevation than the free surface of the coolant in the coolant discharge reservoir. The free surfaces are held at different elevations by the system's recirculating pump(s) and by using in-line flow control valves to regulate coolant flow through the cooling channels. It is understood that the pumping capacity of the recirculating pump(s) may be controlled by varying their pumping speed.

Figure 6A:
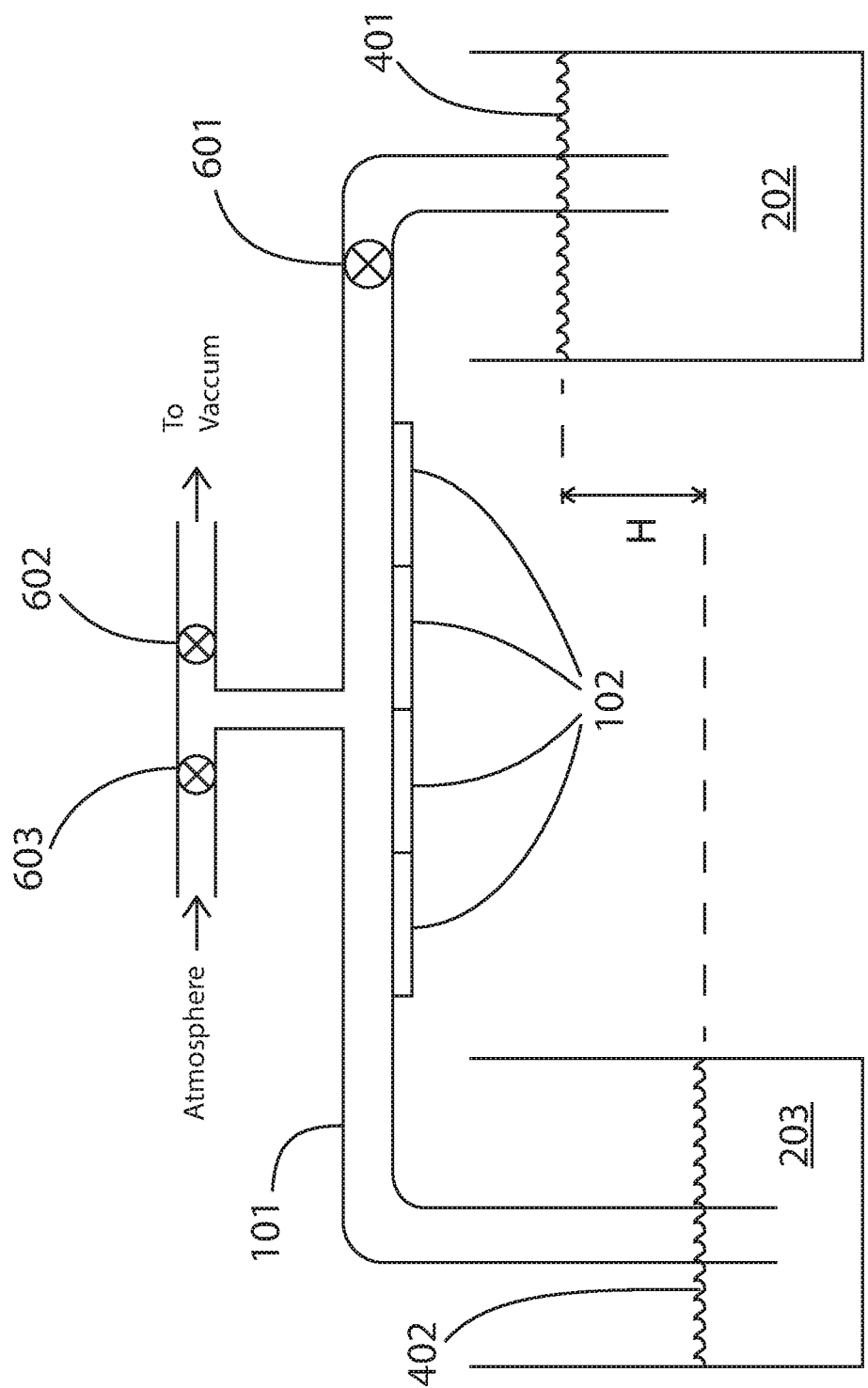
FIG. 6A shows an elevation view of a cooling channel extending between a coolant supply reservoir and a coolant discharge reservoir, with liquid flow in the cooling channel maintained by siphoning pressure produced by an elevation difference, H, between the free surfaces of the open coolant supply and discharge reservoirs.

FIGS. 6A and 6B illustrate the preferred embodiment of the present invention. FIG. 6A illustrates the use of siphoning pressure to drive coolant from coolant supply reservoir 202, through cooling channel 101, and into coolant discharge reservoir 203, thereby cooling solar cell arrays 102. Siphoning pressure is created by maintaining an elevation difference, H, between free surface 401 of the coolant in coolant supply reservoir 202 and the free surface 402 of the coolant in coolant discharge reservoir 203. The present invention is an improvement of VATR systems of the type revealed in U.S. Pat. No. 9,705,448 in that the hydraulic pressure generated by cooling channel pumps is replaced by siphoning pressure. The present invention is also an improvement of VATR systems of the type revealed in U.S. Pat. No. 7,891,351 in that the use of siphoning pressure to drive coolant from end to end through the cooling channels eliminates the need for coolant transfer lines and centrally located rotating seals. The present invention is also an improvement of cooling technology used in TTR systems in that cooling channel pressures are minimized and interconnections of coolant loop components are simplified.

FIG. 6A also shows an in-line flow control valve 601 which regulates flow through cooling channel 101, thereby providing a relatively quick response to varying thermal loads. In-line flow control valve 601 responds to control signals generated by coolant temperature sensors (not shown) that are located within, or on, cooling channel 101. FIG. 6A also shows evacuation valve 602 which can be opened in order to allow an external vacuum pump to evacuate air or other gases from cooling channel 101, thus enabling siphoning pressure to force coolant through cooling channel 101. Also shown is air inlet valve 603 which can be opened to allow atmospheric air to enter cooling channel 101, thus disabling siphoning pressure, interrupting coolant flow, and allowing coolant to drain from cooling channel 101.

FIG. 6B shows a VATR system with a multiplicity of cooling channels that are identical to the one shown in FIG. 6A. Each of the cooling channels 101 shown in FIG. 6B has its own in-line flow control valve 601, its own air evacuation valve 602, and its own air inlet valve 603, as is shown for the single cooling channel of FIG. 6A. For the system shown in FIG. 6B, the pressure required to overcome the frictional forces impeding coolant flow through cooling channels 101 is produced by an elevation difference between free surfaces 401 and 402 of the coolant in open supply and discharge reservoirs 202 and 203, as is shown for the single cooling channel of FIG. 6A.

What is claimed is:

1. A coolant loop for trough reflector systems that have solar cell arrays, wherein said coolant loop is comprised of:
  a) a coolant discharge reservoir containing coolant with a free surface, and
  b) a coolant supply reservoir containing coolant with a free surface, wherein the free surface of the coolant in said coolant supply reservoir is continuously maintained at a higher elevation than the free surface of the coolant in said coolant discharge reservoir, and wherein the elevation difference, H, between the free surface of the coolant in said coolant supply reservoir and the free surface of the coolant in said coolant discharge reservoir can be controlled and set to different desired values by varying the relative amounts of coolant in said coolant supply reservoir and said coolant discharge reservoir, and
  c) a multiplicity of cooling channels, wherein each of said cooling channels has a coolant inlet port at one of its ends and a coolant discharge port at its other end, and wherein each of said cooling channels has an in-line flow control valve located adjacent to its coolant inlet port, and wherein each of said cooling channels has an evacuation port and an evacuation port valve, and wherein each of said cooling channels has an air inlet port and an air inlet port valve, and wherein each of said cooling channels supports solar cell arrays that are attached to a wall of said cooling channel, and wherein the portion of each of said cooling channels to which said solar cell arrays are attached is maintained at a higher elevation than the free surface of the coolant in said coolant supply reservoir, and wherein each of said cooling channels is continuously oriented and positioned so that said attached solar cell arrays intercept concentrated sunlight produced by an optically-associated trough reflector, and wherein each of said cooling channels is physically contoured and spatially positioned so that said coolant inlet port is continuously submerged beneath the free surface of the coolant in said coolant supply reservoir, and wherein each of said cooling channels is physically contoured and spatially positioned so that said coolant discharge port is continuously submerged beneath the free surface of the coolant in said coolant discharge reservoir, and wherein the internal volume of each of said cooling channels is devoid of gaseous species and filled throughout with liquid coolant, thereby establishing said cooling channel as a coolant flow passage with respect to siphoning pressure.

2. A coolant loop as described in claim 1 wherein said elevation difference, H, between the free surface of the coolant in said coolant supply reservoir and the free surface of the coolant in said coolant discharge reservoir is maintained at a value equal to the yearly-critical elevation difference, $H_{yc}$, thereby ensuring adequate cooling for all of said solar cells arrays when direct solar irradiance is less than or equal to its calculated maximum possible value, $I_{YM}$, for the year at the deployment location of said trough reflector system.

3. A coolant loop as described in claim 1 wherein the elevation difference, H, between the free surface of the coolant in said coolant supply reservoir and the free surface of the coolant in said coolant discharge reservoir is reset each day of the year to a value equal to the date-critical elevation difference, $H_{dc}$, for that specific date, thereby ensuring adequate cooling for all of said solar cell arrays when direct solar irradiance is equal to or less than its calculated maximum value, $I_{DM}$, for that specific date at the deployment location of said trough reflector system.

4. A coolant loop as described in claim 1 wherein the coolant flow rate in each of said cooling channels is regulated by said in-line flow control valve, and wherein each of said in-line flow control valves responds to control signals generated by coolant temperature sensors located within said cooling channel.

5. A coolant loop as described in claim 1 wherein said coolant loop is a component of a vertical axis trough reflector system, and wherein said coolant supply reservoir and said coolant discharge reservoir are circular, contiguous, and concentric with the rotating portion of said vertical axis trough reflector system, and wherein said coolant supply reservoir and said coolant discharge reservoir are located at the center of the rotating portion of said vertical axis trough reflector system.

6. A coolant loop as described in claim 1 wherein said coolant loop is a component of a vertical axis trough reflector system, and wherein said coolant supply reservoir and said coolant discharge reservoir are circular, contiguous, and concentric with the rotating portion of said vertical axis trough reflector system, and wherein said coolant supply reservoir and said coolant discharge reservoir are located at the outer periphery of the rotating portion of said vertical axis trough reflector system.

\* \* \* \* \*